United States Patent
Matsumoto et al.

(10) Patent No.: US 10,917,057 B2
(45) Date of Patent: Feb. 9, 2021

(54) POWER AMPLIFIER CIRCUIT

(71) Applicant: Murata Manufacturing Co., Ltd., Kyoto (JP)

(72) Inventors: Hidetoshi Matsumoto, Kyoto (JP); Satoshi Tanaka, Kyoto (JP); Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/654,640

(22) Filed: Oct. 16, 2019

(65) Prior Publication Data

US 2020/0127622 A1    Apr. 23, 2020

(30) Foreign Application Priority Data

Oct. 19, 2018 (JP) ................. 2018-197493

(51) Int. Cl.
    *H03F 1/22*     (2006.01)
    *H03F 3/217*    (2006.01)
    *H03F 3/193*    (2006.01)

(52) U.S. Cl.
    CPC ......... *H03F 3/2178* (2013.01); *H03F 3/1935* (2013.01); *H03F 2203/21131* (2013.01)

(58) Field of Classification Search
    CPC ....................................................... H03F 1/22
    USPC .................................................. 330/311, 302
    See application file for complete search history.

(56) References Cited

U.S. PATENT DOCUMENTS

| | | | |
|---|---|---|---|
| 9,698,734 B2 * | 7/2017 | Lehtola | ..... H03F 3/24 |
| 9,698,736 B2 | 7/2017 | Ripley et al. | |
| 2017/0359038 A1 | 12/2017 | Tanaka et al. | |

FOREIGN PATENT DOCUMENTS

JP          2017-225104 A     12/2017

* cited by examiner

*Primary Examiner* — Henry Choe
(74) *Attorney, Agent, or Firm* — Pearne & Gordon LLP

(57) ABSTRACT

A power amplifier circuit includes a first transistor, wherein a radio frequency signal is inputted to a base or gate of the first transistor; a second transistor having an emitter connected to a collector or drain of the first transistor, wherein a first voltage is supplied to a collector of the second transistor, and a first amplified signal obtained by amplifying the radio frequency signal is outputted from the collector of the second transistor; and a third transistor configured to supply a bias voltage to a base of the second transistor. A second voltage is supplied to a collector or drain of the third transistor, a third voltage corresponding to the first voltage is supplied to a base or gate of the third transistor, and the bias voltage, which corresponds to the third voltage, is supplied from an emitter or source of the third transistor.

18 Claims, 7 Drawing Sheets

FIG. 5

POWER AMPLIFIER CIRCUIT

This application claims priority from Japanese Patent Application No. 2018-197493 filed on Oct. 19, 2019. The content of this application is incorporated herein by reference in its entirety.

BACKGROUND OF THE DISCLOSURE

1. Field of the Disclosure

The present disclosure relates to a power amplifier circuit.

2. Description of the Related Art

In mobile communication devices such as mobile phones, power amplifier circuits are used to amplify the power of radio frequency (RF) signals to be transmitted to base stations.

For example, Japanese Unexamined Patent Application Publication No. 2017-225104 describes a power amplifier circuit including a common-base stage transistor and a common-emitter stage transistor that are cascode-connected to each other. In the power amplifier circuit, a power supply voltage is divided using two resistance elements and one diode that are connected in series with each other, and a voltage equal to the voltage across the one diode and one of the resistance elements is supplied as the base voltage of the common-base stage transistor. When an RF signal is supplied to the base of the common-emitter stage transistor, an amplified signal is outputted from the collector of the common-base stage transistor.

However, in the power amplifier circuit described above, if the RF signal is increased, the base current of the common-base stage transistor is increased and the base voltage thereof is decreased. The decrease in the base voltage decreases the maximum output current of the common-emitter stage transistor. As a result, the maximum output power of the entire power amplifier circuit is reduced.

BRIEF SUMMARY OF THE DISCLOSURE

Accordingly, it is an object of the present disclosure to provide a power amplifier circuit in which a reduction in maximum output power can be controlled.

According to preferred embodiments of the present disclosure, a power amplifier circuit includes a first transistor, wherein a radio frequency signal is inputted to a base or gate of the first transistor; a second transistor having an emitter connected to a collector or drain of the first transistor, wherein a first voltage is supplied to a collector of the second transistor, and a first amplified signal obtained by amplifying the radio frequency signal is outputted from the collector of the second transistor; and a third transistor configured to supply a bias voltage to a base of the second transistor. A second voltage is supplied to a collector or drain of the third transistor, a third voltage corresponding to the first voltage is supplied to a base or gate of the third transistor, and the bias voltage, which corresponds to the third voltage, is supplied from an emitter or source of the third transistor.

With this configuration, a bias voltage can be supplied to the base of the second transistor, which is a common-base stage transistor, via the emitter or source of the third transistor. Accordingly, even if an RF signal is increased and the base current of the common-base stage transistor is increased, the bias voltage is supplied from the third transistor, which is an emitter follower transistor or a source follower transistor, and thus the base voltage of the second transistor is not decreased. As a result, a reduction in the maximum output power of the power amplifier circuit is controlled.

According to preferred embodiments of the present disclosure, it may be possible to provide a power amplifier circuit in which a reduction in maximum output power can be controlled.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

The following describes an embodiment of the present disclosure in detail with reference to the drawings. The same or substantially the same elements are denoted by the same numerals, and will not be repeatedly described.

Figure 1:
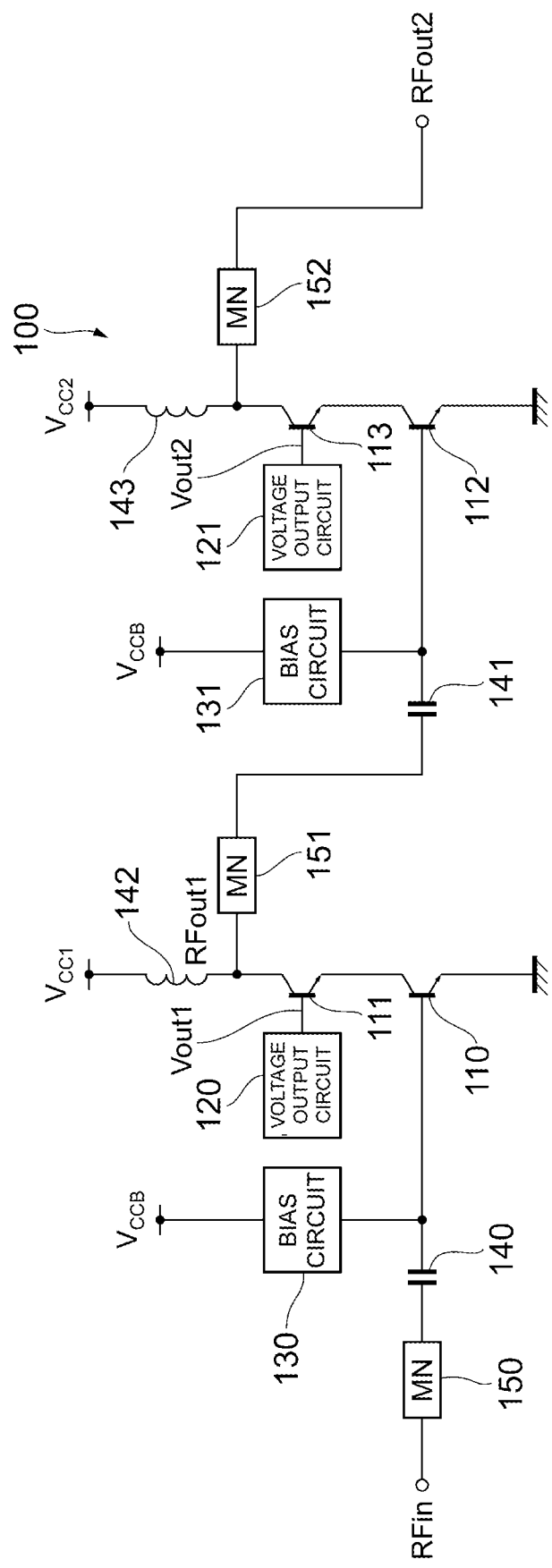
FIG. 1 illustrates an example configuration of a power amplifier circuit according to an embodiment of the present disclosure.

FIG. 1 illustrates an example configuration of a power amplifier circuit 100 according to an embodiment of the present disclosure. The power amplifier circuit 100 is included in, for example, a mobile communication device such as a mobile phone, and is configured to amplify an input radio frequency (RF) signal RFin and to output an amplified signal RFout2. The RF signal RFin has a frequency of about several gigahertz (GHz), for example.

As illustrated in FIG. 1, the power amplifier circuit 100 includes bipolar transistors 110, 111, 112, and 113, voltage output circuits 120 and 121, bias circuits 130 and 131, capacitors 140 and 141, inductors 142 and 143, and matching networks (MNs) 150, 151, and 152.

The power amplifier circuit 100 includes two stages of amplifiers. The first-stage (drive-stage) amplifier includes the bipolar transistors 110 and 111, and the second-stage (power-stage) amplifier includes the bipolar transistors 112 and 113. In the following description, the two bipolar transistors 110 and 111 or 112 and 113 are collectively referred to also as an amplifier. The drive-stage amplifier amplifies the RF signal RFin inputted via the matching network 150 and outputs an amplified signal RFout1 (first amplified signal). The amplified signal RFout1 is inputted to the power-stage amplifier via the matching network 151. The power-stage amplifier amplifies the amplified signal RFout1 and outputs the amplified signal RFout2 via the matching network 152.

The bipolar transistor 110 (first transistor) is a common-emitter stage transistor and is cascode-connected to the bipolar transistor 111 (second transistor). A collector of the bipolar transistor 110 is connected to an emitter of the bipolar transistor 111, a base of the bipolar transistor 110 is connected to an end of the capacitor 140, and an emitter of the bipolar transistor 110 is grounded. The RF signal RFin and a bias current outputted from the bias circuit 130 are supplied to the base of the bipolar transistor 110.

Likewise, the bipolar transistor 112 (first transistor) is a common-emitter stage transistor and is cascode-connected to the bipolar transistor 113 (second transistor). A collector of the bipolar transistor 112 is connected to an emitter of the bipolar transistor 113, a base of the bipolar transistor 112 is connected to an end of the capacitor 141, and an emitter of the bipolar transistor 112 is grounded. The amplified signal RFout1 and a bias current outputted from the bias circuit 131 are supplied to the base of the bipolar transistor 112. The gain characteristics of the bipolar transistors 110 and 112 may be controlled in accordance with the bias currents supplied from the bias circuits 130 and 131, respectively.

The bipolar transistors 111 and 113 are common-base stage transistors and are cascode-connected to the bipolar transistors 110 and 112, respectively. Specifically, a power supply voltage $V_{CC1}$ (first voltage) is supplied to a collector of the bipolar transistor 111 via the inductor 142, a base of the bipolar transistor 111 is connected to the voltage output circuit 120, and the emitter of the bipolar transistor 111 is connected to the collector of the bipolar transistor 110. Accordingly, the amplified signal RFout1, which is obtained by amplification with the bipolar transistors 110 and 111, is outputted from the collector of the bipolar transistor 111. Likewise, a power supply voltage $V_{CC2}$ is supplied to a collector of the bipolar transistor 113 via the inductor 143, a base of the bipolar transistor 113 is connected to the voltage output circuit 121, and the emitter of the bipolar transistor 113 is connected to the collector of the bipolar transistor 112. Accordingly, an amplified signal, which is obtained by amplification with the bipolar transistors 112 and 113, is outputted from the collector of the bipolar transistor 113.

Since the bipolar transistor 110 and the bipolar transistor 111 are cascode-connected to each other, a voltage obtained by dividing the power supply voltage $V_{CC1}$ is applied to the collector and emitter of each of the bipolar transistors 110 and 111. With this configuration, the voltage value of the power supply voltage $V_{CC1}$ can be about twice as high as that obtained with a configuration in which the bipolar transistor 111 is not connected to the bipolar transistor 110. Specifically, for example, when the withstand voltage between the collector and emitter of each of the bipolar transistors 110 and 111 is about 6 V, the power supply voltage $V_{CC1}$ can be about 12 V. The bipolar transistors 112 and 113 in the power stage are similar to the bipolar transistors 110 and 111 in the drive stage, respectively, and will not be described in detail herein.

The bipolar transistor 111 may be smaller in size than the bipolar transistor 110. The number of cascode-connected bipolar transistors is not limited to two, and three or more bipolar transistors may be cascode-connected to each other. In this case, a voltage obtained by dividing a power supply voltage by the number of bipolar transistors is applied to the collector and emitter of each of the bipolar transistors, and thus the allowed upper limit voltage value of the power supply voltage is further increased.

The voltage output circuits 120 and 121 generate a bias voltage Vout1 and an output voltage Vout2 corresponding to the power supply voltages $V_{CC1}$ and $V_{CC2}$, respectively, and supply the bias voltages Vout1 and Vout2 to the bases of the bipolar transistors 111 and 113, respectively. Thus, the base voltages of the bipolar transistors 111 and 113 adaptively change in accordance with the values of the power supply voltages $V_{CC1}$ and $V_{CC2}$, respectively. Accordingly, unlike a configuration in which the base voltage of an upper bipolar transistor is fixed, a power supply voltage is substantially equally divided into collector-emitter voltages of a plurality of cascode-connected bipolar transistors. With this configuration, the power supply voltages $V_{CC1}$ and $V_{CC2}$ can be further increased, compared to a configuration in which the base voltages of upper bipolar transistors are fixed. The configuration of the voltage output circuits 120 and 121 will be described in detail below.

The bias circuits 130 and 131 generate bias currents or voltages and supply the bias currents or voltages to the bases of the bipolar transistors 110 and 112, respectively.

Figure 2:
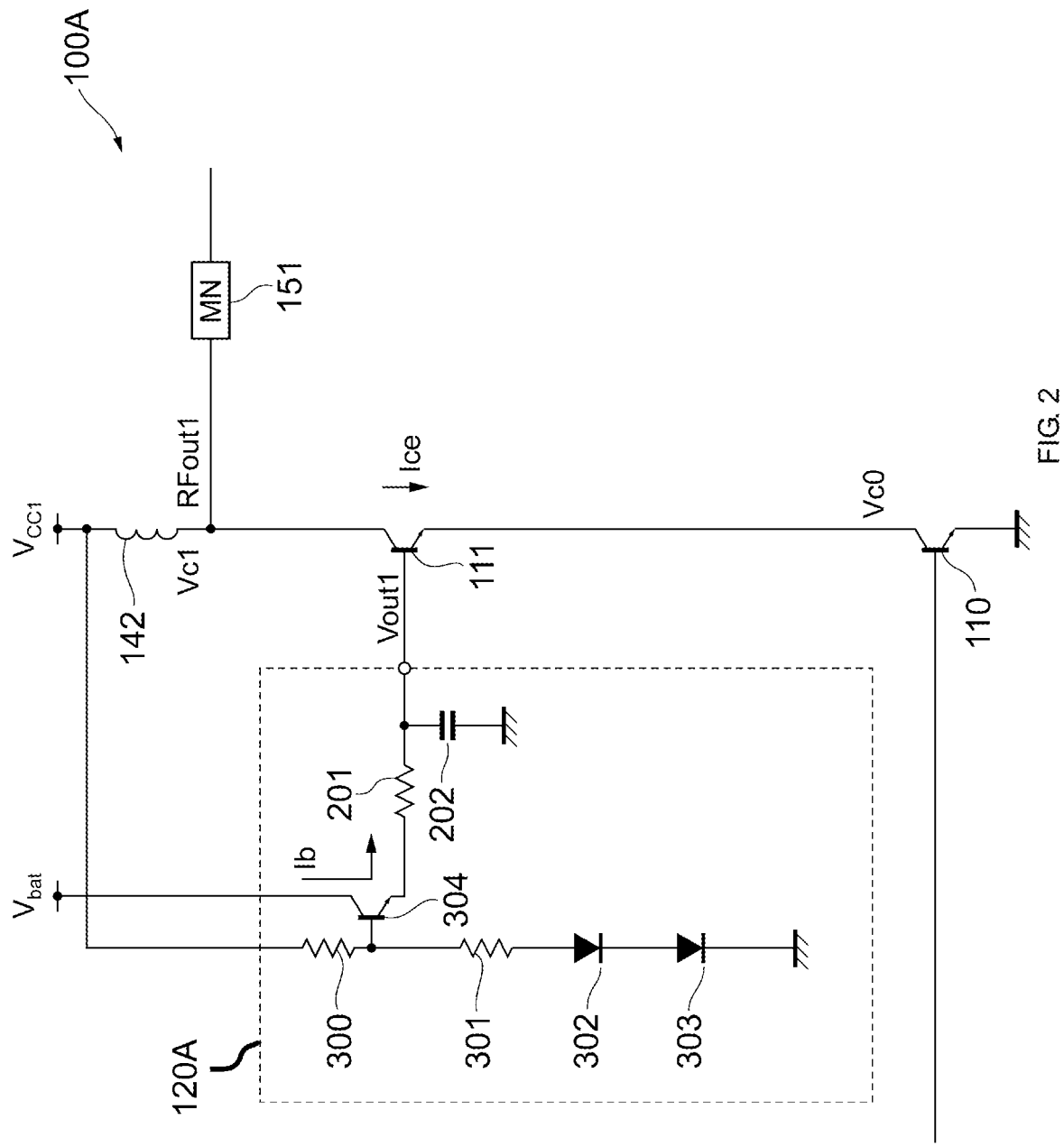
FIG. 2 illustrates an example configuration of a voltage output circuit in a power amplifier circuit that is an example of the power amplifier circuit according to the embodiment of the present disclosure.

FIG. 2 illustrates an example configuration (voltage output circuit 120A) of the voltage output circuit 120 in a power amplifier circuit 100A that is an example of the power amplifier circuit 100. In FIG. 2, for convenience of illustration, among the components of the power amplifier circuit 100A, only the voltage output circuit 120A, the bipolar transistors 110 and 111, the inductor 142, and the matching network 151 are illustrated. The same or substantially the same elements as those in the power amplifier circuit 100 are assigned the same numerals, and will not be described.

The voltage output circuit 120A includes resistance elements 201, 300, and 301, diodes 302 and 303, a bipolar transistor 304, and a capacitor 202.

The bipolar transistor 304 (third transistor) is an emitter follower transistor. A power supply voltage $V_{bat}$ (second voltage) is supplied to a collector of the bipolar transistor 304, and an emitter of the bipolar transistor 304 is connected to the bipolar transistor 111 via the resistance element 201. A current Ib flows into the collector of the bipolar transistor 304 from the power supply voltage $V_{bat}$, and the current Ib flows out of the emitter of the bipolar transistor 304.

The resistance elements 300 and 301 (second resistance element) and the diodes 302 and 303 are connected in series with each other. An end of the resistance element 300 is connected to the power supply side (an end of the inductor 142), and a cathode of the diode 303 is grounded. Further, a node of the resistance element 300 and the resistance element 301 is connected to a base of the bipolar transistor 304. That is, a voltage (third voltage) corresponding to the power supply voltage $V_{CC1}$ (first voltage) is supplied to the base of the bipolar transistor 304. The diodes 302 and 303 may be diode-connected bipolar transistors, each of which has a base and a collector connected to each other.

The resistance element 201 is a ballast resistor and has an end connected to the emitter of the bipolar transistor 304 and another end connected to the base of the bipolar transistor 111. Since an emitter follower transistor has a low output impedance, thermal runaway of the bipolar transistor 111 in the common-base stage is likely to occur. The resistance element 201, which is a ballast resistor, can suppress the thermal runaway.

The capacitor 202 is a bypass capacitor. One end of the capacitor 202 is connected between the resistance element 201 and the base of the bipolar transistor 111, and another end of the capacitor 202 is grounded. The resistance element 201, which is a ballast resistor, can suppress the thermal runaway of the bipolar transistor 111 in the common-base stage, but may cause a side effect of increased output impedance of the voltage output circuit 120A at RF frequencies, resulting in a reduction in the gain of the bipolar transistor 111 in the common-base stage. The capacitor 202 can reduce the output impedance of the voltage output circuit 120A at RF frequencies, and can control a reduction in the gain of the bipolar transistor 111 in the common-base stage.

With the configuration described above, a voltage (third voltage) obtained by dividing the power supply voltage $V_{CC1}$ (first voltage) using the resistance elements 300 and 301 and the diodes 302 and 303 is supplied to the base of the bipolar transistor 304. The bias voltage Vout1, which corresponds to the third voltage, is supplied from the emitter of the bipolar transistor 304 to the base of the bipolar transistor 111 via the resistance element 201. Accordingly, the voltage output circuit 120A supplies the bias voltage Vout1 to the base of the bipolar transistor 111.

Figure 3:
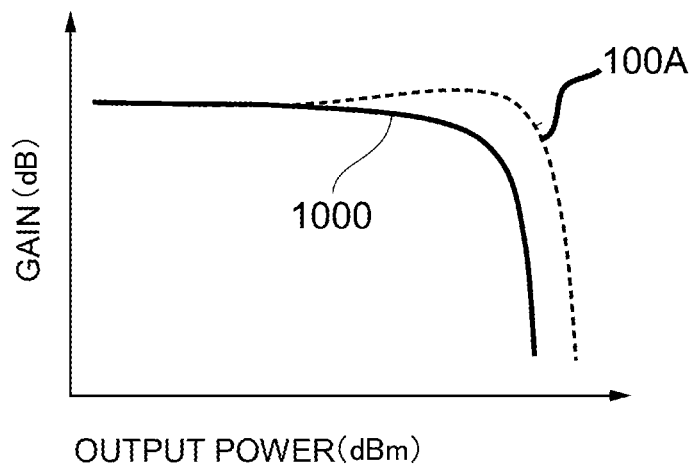
FIG. 3 illustrates the relationship between the output power (dBm) and gain (dB) of the power amplifier circuit illustrated in FIG. 2.

An advantage of the power amplifier circuit 100A will be described with reference to FIG. 3. FIG. 3 illustrates the relationship between the output power (dBm) and gain (dB) of the power amplifier circuit 100A. In FIG. 3, line 100A indicates the power amplifier circuit 100A, and line 1000 indicates a power amplifier circuit 1000 to be compared.

Figure 4:
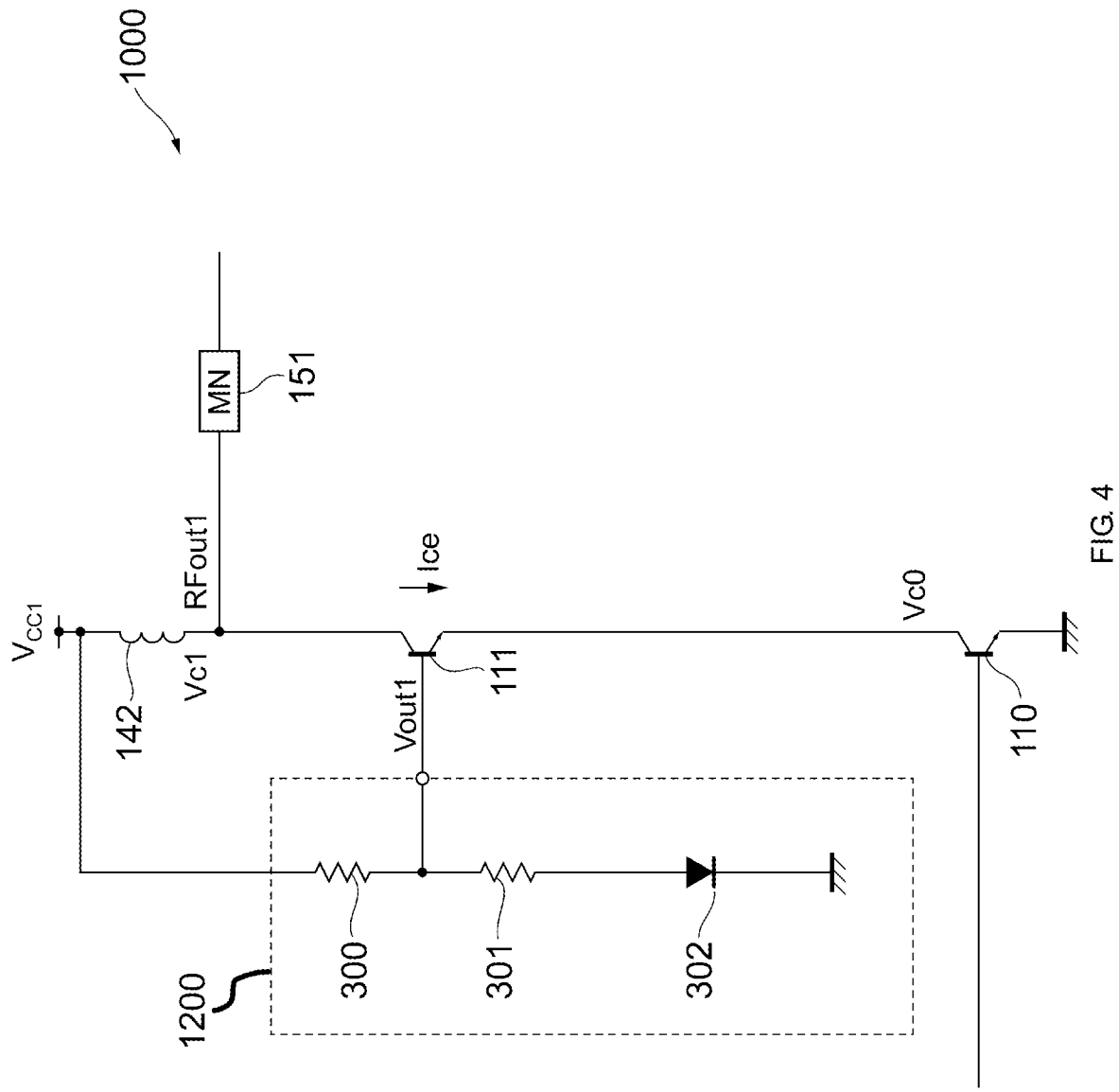
FIG. 4 illustrates an example configuration of a voltage output circuit in a power amplifier circuit to be compared.

A voltage output circuit 1200 of the power amplifier circuit 1000 to be compared has a configuration illustrated in FIG. 4. That is, unlike the power amplifier circuit 100 according to the embodiment, the voltage output circuit 1200 does not include the bipolar transistor 304, the resistance element 201, the capacitor 202, or the diode 303. The other configuration of the power amplifier circuit 1000, except for the voltage output circuit 1200, is similar to that of the power amplifier circuit 100A.

As illustrated in FIG. 3, in an area with low output power, there is no large difference in gain between the power amplifier circuit 100A and the power amplifier circuit 1000 to be compared. In an area with high output power, however, the gain of the power amplifier circuit 1000 to be compared gradually decreases, whereas the gain of the power amplifier circuit 100A changes by a small amount. This indicates that, in the power amplifier circuit 100A, a reduction in maximum output power is controlled.

The reason for this is as follows. In the power amplifier circuit 1000 to be compared, if the power of an RF signal is increased, a current Ice flowing through the bipolar transistor 111 from the power supply voltage $V_{CC1}$ is increased. With the increase in the current Ice, a current flowing into the base of the bipolar transistor 111 from the power supply voltage $V_{CC1}$ via the resistance element 300 is also increased, resulting in an increase in the voltage drop across the resistance element 300 and also a decrease in the base voltage of the bipolar transistor 111. The decrease in the base voltage of the bipolar transistor 111 decreases the maximum output current of the bipolar transistor 110 in the common-emitter stage. As a result, the maximum output power of the power amplifier circuit 1000 is also reduced.

In the power amplifier circuit 100A, in contrast, the current Ib flowing into the base of the bipolar transistor 111 in the common-base stage is supplied from the power supply voltage $V_{bat}$ via the bipolar transistor 304, which is an emitter follower transistor. Even if the power of an RF signal is increased, the current flowing through the resistance elements 300 and 301 and the diodes 302 and 303 from the power supply voltage $V_{CC1}$ is not largely increased. Thus, a decrease in the base voltage of the bipolar transistor 111 is controlled. As a result, a reduction in the maximum output power of the power amplifier circuit 100 is also controlled.

Figure 5:
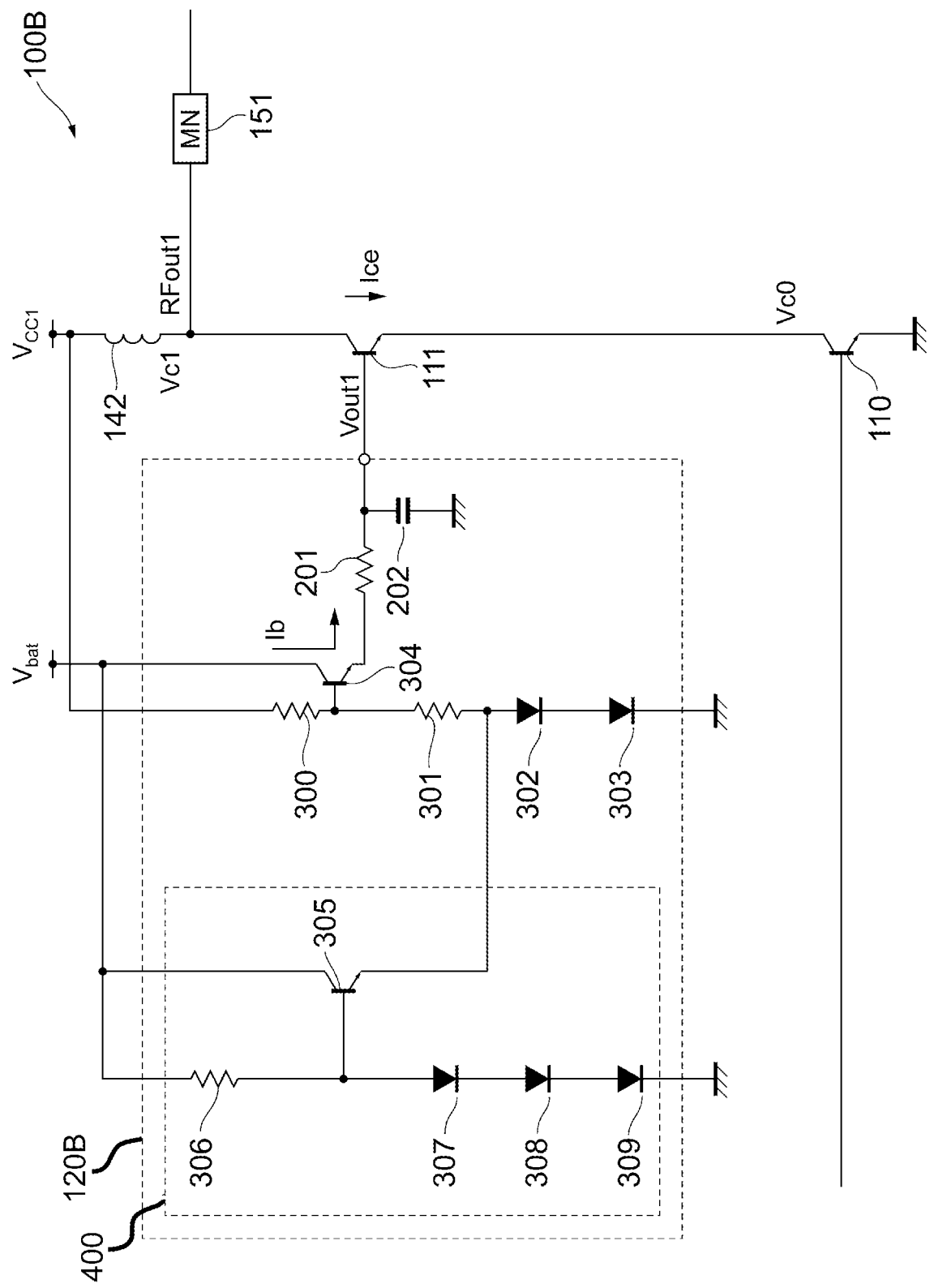
FIG. 5 illustrates an example configuration of a voltage output circuit in a power amplifier circuit that is another example of the power amplifier circuit according to the embodiment of the present disclosure.

FIG. 5 illustrates an example configuration (voltage output circuit 120B) of the voltage output circuit 120 in a power amplifier circuit 100B that is another example of the power amplifier circuit 100. In FIG. 5, for convenience of illustration, among the components of the power amplifier circuit 100B, only the voltage output circuit 120B, the bipolar transistors 110 and 111, the inductor 142, and the matching network 151 are illustrated. The same or substantially the same elements as those in the power amplifier circuit 100 are assigned the same numerals, and will not be described.

The voltage output circuit 120B includes, in addition to the components of the voltage output circuit 120A, a voltage-decrease control circuit 400 configured to prevent a decrease in voltage supplied to the base of the bipolar transistor 111 from the voltage output circuit 120A. The voltage-decrease control circuit 400 includes a resistance element 306, diodes 307, 308, and 309, and a bipolar transistor 305.

The resistance element 306 and the diodes 307, 308, and 309 are connected in series with each other. An end of the resistance element 306 is connected to the power supply voltage $V_{bat}$, and a cathode of the diode 309 is grounded. A node of the resistance element 306 and an anode of the diode 307 is connected to a base of the bipolar transistor 305 (fourth transistor). A voltage (fourth voltage) obtained by dividing the power supply voltage $V_{bat}$ (second voltage) using the resistance element 306 and the diodes 307, 308, and 309 is supplied to the base of the bipolar transistor 305. The power supply voltage $V_{bat}$ is supplied to a collector of the bipolar transistor 305, and an emitter of the bipolar transistor 305 is connected to a node of the resistance element 301 and the diode 302.

Figure 6:
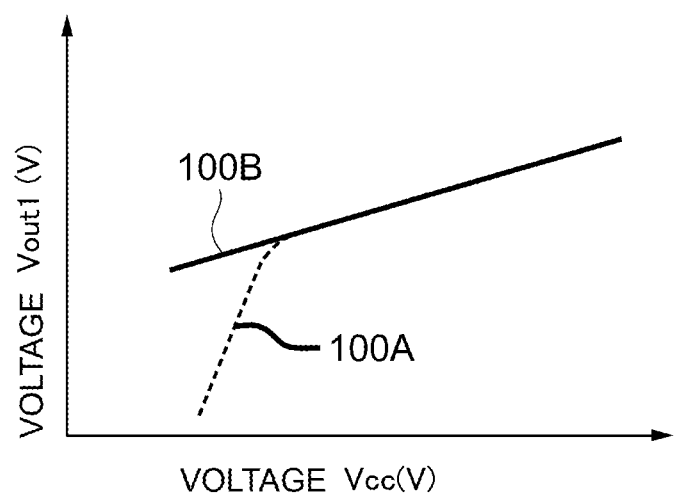
FIG. 6 illustrates the relationship between a power supply voltage (V) for the power amplifier circuits illustrated in FIGS. 2 and 5 and a bias voltage (V) supplied to the base of a bipolar transistor.

FIG. 6 illustrates the relationship between a power supply voltage Vcc (V) for the power amplifier circuits 100A and 100B and the bias voltage Vout1 (V) supplied to the base of the bipolar transistor 111. In FIG. 6, line 100A indicates the power amplifier circuit 100A, and line 100B indicates the power amplifier circuit 100B.

As illustrated in FIG. 6, in the power amplifier circuit 100A, as the power supply voltage Vcc decreases, the bias voltage Vout1 supplied to the base of the bipolar transistor 111 gradually decreases. When the power supply voltage Vcc becomes lower than the predetermined voltage (the sum of the on voltage of the diode 302 and the on voltage of the diode 303), the bias voltage Vout1 supplied to the base of the bipolar transistor 111 steeply decreases. The reason for this is as follows. When the power supply voltage Vcc is higher than the predetermined voltage, the diodes 302 and 303 are in an on state, and the anode voltage of the diode 302 is substantially equal to the predetermined voltage. The difference between the power supply voltage Vcc and the predetermined voltage is distributed to the resistance elements 300 and 301, and the voltage at the intermediate node of the resistance elements 300 and 301 is applied to the base of the bipolar transistor 304. Thus, the change in the base voltage of the bipolar transistor 304 with a change in the power supply voltage Vcc is small, and the change in the bias voltage Vout1 outputted via the emitter-follower bipolar transistor 304 and the resistance element 201 is also small. When the power supply voltage Vcc is lower than the predetermined voltage, on the other hand, the diodes 302 and 303 are in an off state, and the power supply voltage Vcc is applied to the base of the bipolar transistor 304 via the resistance element 300. Thus, the change in the base voltage of the bipolar transistor 304 with a change in the power supply voltage Vcc is large, and the change in the bias voltage Vout1 outputted via the emitter-follower bipolar transistor 304 and the resistance element 201 is also large.

In the power amplifier circuit 100B, in contrast, as illustrated in FIG. 6, as the power supply voltage Vcc decreases, the bias voltage Vout1 supplied to the base of the bipolar transistor 111 gradually decreases. Unlike the power amplifier circuit 100A, the bias voltage Vout1 does not steeply decrease in an area where the power supply voltage Vcc is low. The reason for this is as follows. When the power supply voltage Vcc is higher than the predetermined voltage, as in the power amplifier circuit 100A, the diodes 302 and 303 are in the on state, and the anode voltage of the diode 302 is substantially equal to the predetermined voltage. Thus, the change in the bias voltage Vout1 with a change in the power supply voltage Vcc is small. When the power supply voltage Vcc is lower than the predetermined voltage, on the other hand, unlike the power amplifier circuit 100A, due to the operation of the voltage-decrease control circuit 400, the anode voltage of the diode 302 is kept at a voltage substantially equal to the predetermined voltage. The difference between the power supply voltage Vcc and the predetermined voltage is distributed to the resistance elements 300 and 301, and the voltage at the intermediate node of the resistance elements 300 and 301 is applied to the base of the bipolar transistor 304. Thus, the change in the base voltage supplied to the base of the bipolar transistor 304 with a change in the power supply voltage Vcc is small, and the change in the bias voltage Vout1 outputted via the emitter-follower bipolar transistor 304 and the resistance element 201 is also small.

The advantage of the power amplifier circuit 100B described above is effective in particular for average power tracking (APT) or envelope tracking (ET) operation for controlling the power supply voltage Vcc in accordance with the power level.

Figure 7:
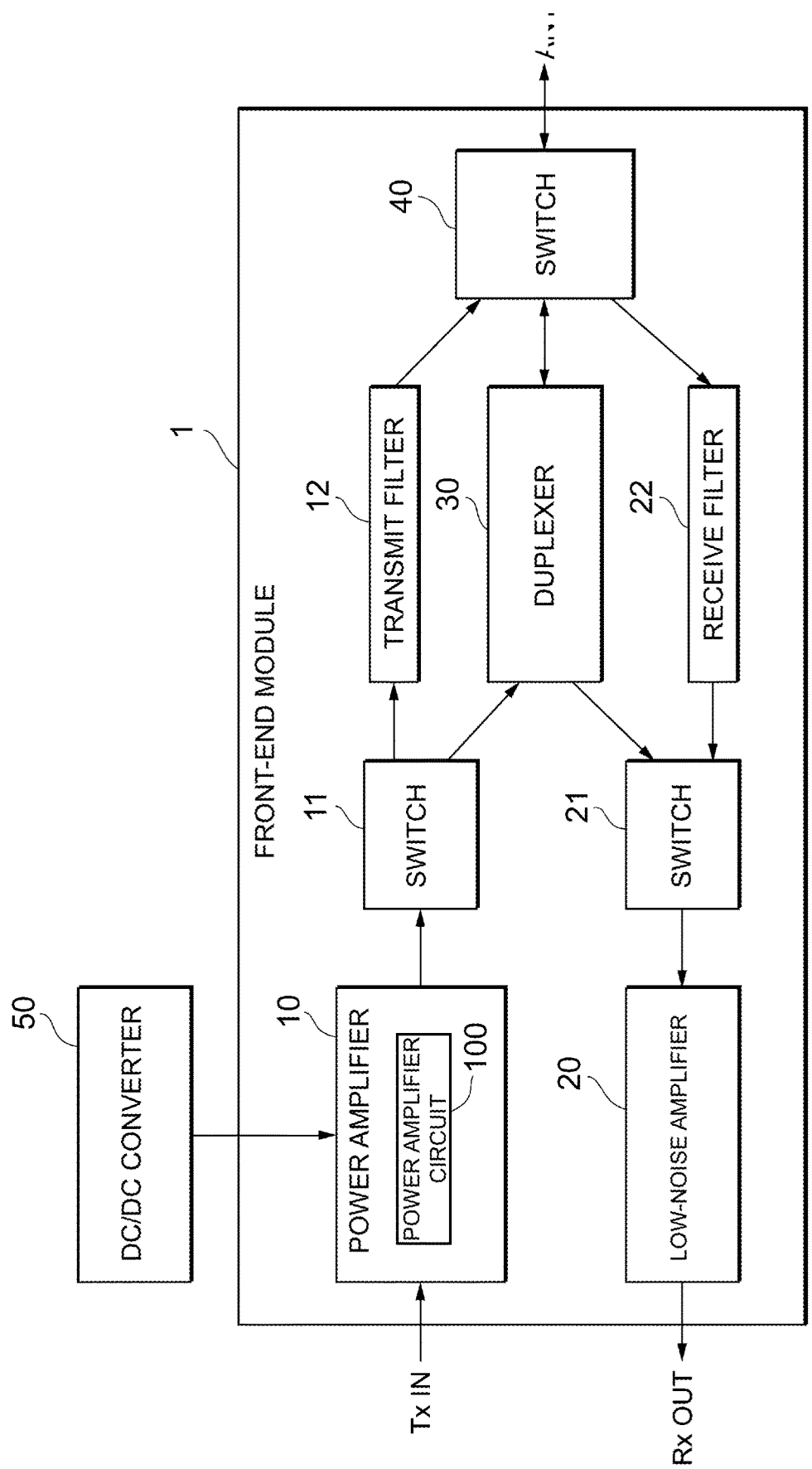
FIG. 7 is a schematic block diagram of a front-end module including the power amplifier circuit according to the embodiment of the present disclosure.

FIG. 7 is a schematic block diagram of a front-end module 1 including the power amplifier circuit 100 according to the embodiment of the present disclosure.

The front-end module 1 is included in, for example, a mobile communication device such as a mobile phone, and is used to transmit and receive various signals such as audio signals or data signals to and from a base station. The front-end module 1 supports a plurality of RF frequency bands (multiband). The front-end module 1 also supports a plurality of communication modes (multimode) such as 3G (third-generation mobile communication systems), 4G (fourth-generation mobile communication systems), and 5G (fifth-generation mobile communication systems). The front-end module 1 may support other communication modes. The front-end module 1 may support carrier aggregation.

The front-end module 1 has a terminal TxIN to which a transmit signal is inputted, a terminal RxOUT from which a receive signal is outputted, and a terminal ANT that is connected to an antenna. A path connecting the terminal TxIN and the terminal ANT forms a transmit signal path, and a path connecting the terminal ANT and the terminal RxOUT forms a receive signal path.

The front-end module 1 includes, for example, a power amplifier 10, a switch 11, a transmit filter 12, a low-noise amplifier 20, a switch 21, a receive filter 22, a duplexer 30, and a switch 40. Power is supplied to the power amplifier 10 from a direct current-direct current (DC/DC) converter 50, for example.

A transmit signal supplied from the terminal TxIN is supplied to the power amplifier 10. The power amplifier 10 includes the power amplifier circuit 100 according to the embodiment of the present disclosure. The power amplifier 10 amplifies, with the power amplifier circuit 100, the power of the transmit signal supplied from the terminal TxIN to a level necessary to transmit the transmit signal to a base station, and outputs the amplified transmit signal to the switch 11.

The switch 11 selectively supplies the transmit signal supplied from the power amplifier 10 to the transmit filter 12 or the duplexer 30. The transmit filter 12 removes spurious frequency components or out-of-band interference components from the transmit signal and transmits frequencies in a predetermined band. The transmit signal transmitted through the transmit filter 12 travels through the switch 40 and is supplied from the terminal ANT to the antenna. The antenna transmits the supplied transmit signal to the base station or the like.

The antenna receives a receive signal from the base station or the like and supplies the receive signal to the terminal ANT. The receive signal supplied from the terminal ANT is supplied to the switch 40. The switch 40 selectively supplies the receive signal supplied from the terminal ANT to the receive filter 22 or the duplexer 30. The receive filter 22 removes spurious frequency components or out-of-band interference components from the receive signal and transmits frequencies in a predetermined band. The receive signal transmitted through the receive filter 22 is supplied to the low-noise amplifier 20 through the switch 21. The switch 21 selectively connects the low-noise amplifier 20 to the receive filter 22 or the duplexer 30. The low-noise amplifier 20 amplifies the receive signal and outputs the amplified receive signal from the terminal RxOUT to an RF integrated circuit (RFIC) (not illustrated) or the like.

A power amplifier circuit according to an embodiment of the present disclosure has been described. A power amplifier circuit according to an embodiment of the present disclosure includes a first transistor, wherein a radio frequency signal is inputted to a base or gate of the first transistor; a second transistor having an emitter connected to a collector or drain of the first transistor, wherein a first voltage is supplied to a collector of the second transistor, and a first amplified signal obtained by amplifying the radio frequency signal is outputted from the collector of the second transistor; and a third transistor configured to supply a bias voltage to a base of the second transistor. A second voltage is supplied to a collector or drain of the third transistor, a third voltage corresponding to the first voltage is supplied to a base or gate of the third transistor, and the bias voltage, which corresponds to the third voltage, is supplied from an emitter or source of the third transistor.

With this configuration, a bias voltage can be supplied to the base of the second transistor, which is a common-base stage transistor, via the emitter or source of the third transistor. Accordingly, even if an RF signal is increased and the base current of the common-base stage transistor is increased, the bias voltage is supplied from the third transistor, which is an emitter follower transistor or a source follower transistor, and thus the base voltage of the second transistor is not decreased. As a result, a reduction in the maximum output power of the power amplifier circuit is controlled.

The power amplifier circuit may further include a first resistance element connected between the base of the second transistor and the emitter or source of the third transistor.

With this configuration, the first resistance element serves as a ballast resistor, and thus the thermal runaway of the power amplifier circuit is suppressed.

The power amplifier circuit may further include a capacitor having an end connected between the base of the second transistor and the emitter or source of the third transistor, and another end grounded.

With this configuration, the ballast resistor can control a reduction in the gain of the second transistor.

The power amplifier circuit may further include a voltage divider circuit configured to divide the first voltage to generate the third voltage.

With this configuration, the bias voltage for the second transistor is easily controlled.

In the power amplifier circuit, the voltage divider circuit may include at least one series-connected second resistance element or diode.

With this configuration, the bias voltage for the second transistor is easily controlled with a simple configuration.

In the power amplifier circuit, the voltage divider circuit may include two series-connected diodes.

With this configuration, the bias voltage for the second transistor is easily controlled with a simple configuration.

The power amplifier circuit may further include a voltage-decrease control circuit configured to control a decrease in the bias voltage.

With this configuration, a decrease in the bias voltage for the second transistor can be controlled.

In the power amplifier circuit, the voltage-decrease control circuit may include a fourth transistor, the second voltage may be supplied to a collector or drain of the fourth transistor, a fourth voltage corresponding to the second voltage may be supplied to a base or gate of the fourth transistor, and an emitter or source of the fourth transistor may be connected to the voltage divider circuit.

With this configuration, a decrease in the bias voltage for the second transistor can be controlled with a simple configuration.

The embodiment described above is intended to help easily understand the present disclosure and is not to be used to construe the present disclosure in a limiting fashion. Elements included in the embodiment and the arrangements, materials, conditions, shapes, sizes, and so on thereof are not limited to those illustrated exemplarily but can be modified as appropriate. In addition, configurations given in different embodiments may be partially replaced or combined.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   a first transistor, wherein a radio frequency signal is inputted to a base or gate of the first transistor;
   a second transistor having an emitter connected to a collector or drain of the first transistor, wherein a first voltage is supplied to a collector of the second transistor, and a first amplified signal obtained by amplifying the radio frequency signal is outputted from the collector of the second transistor; and
   a third transistor configured to supply a bias voltage to a base of the second transistor, wherein
   a second voltage is supplied to a collector or drain of the third transistor,
   a third voltage corresponding to the first voltage is supplied to a base or gate of the third transistor, and
   the bias voltage, which corresponds to the third voltage, is supplied to the base of the second transistor from an emitter or source of the third transistor.

2. The power amplifier circuit according to claim 1, further comprising
   a first resistance element connected between the base of the second transistor and the emitter or source of the third transistor.

3. The power amplifier circuit according to claim 2, further comprising
   a capacitor having an end connected to a line between the base of the second transistor and the emitter or source of the third transistor, and another end grounded.

4. The power amplifier circuit according to claim 1, further comprising
   a voltage divider circuit configured to divide the first voltage to generate the third voltage.

5. The power amplifier circuit according to claim 2, further comprising
   a voltage divider circuit configured to divide the first voltage to generate the third voltage.

6. The power amplifier circuit according to claim 3, further comprising
   a voltage divider circuit configured to divide the first voltage to generate the third voltage.

7. The power amplifier circuit according to claim 4, wherein
   the voltage divider circuit includes at least one second resistance element and at least one diode connected in series with each other.

8. The power amplifier circuit according to claim 7, wherein
   the voltage divider circuit includes two diodes connected in series with each other.

9. The power amplifier circuit according to claim 4, further comprising
   a voltage-decrease control circuit configured to control a decrease in the bias voltage.

10. The power amplifier circuit according to claim 7, further comprising
    a voltage-decrease control circuit configured to control a decrease in the bias voltage.

11. The power amplifier circuit according to claim 8, further comprising
    a voltage-decrease control circuit configured to control a decrease in the bias voltage.

12. The power amplifier circuit according to claim 9, wherein
    the voltage-decrease control circuit includes a fourth transistor,
    the second voltage is supplied to a collector or drain of the fourth transistor,
    a fourth voltage corresponding to the second voltage is supplied to a base or gate of the fourth transistor, and
    an emitter or source of the fourth transistor is connected to the voltage divider circuit.

13. The power amplifier circuit according to claim 12, wherein
    the voltage-decrease control circuit includes at least one third resistance element and at least one diode connected in series with each other.

14. The power amplifier circuit according to claim 13, wherein the emitter or source of the fourth transistor is connected to a node of between the third resistance element and the at least one diode.

15. The power amplifier circuit according to claim 9, wherein
the voltage-decrease control circuit includes at least one third resistance element and at least one diode connected in series with each other.

16. A front-end module comprising the power amplifier circuit according to claim 1.

17. A front-end module configured to support a carrier aggregation scheme, the front-end module comprising the power amplifier circuit according to claim 1.

18. A front-end module comprising:
a power amplifier;
at least one switch;
a transmit filter;
a low-noise amplifier;
a receive filter; and
a duplexer,
wherein the power amplifier comprises the power amplifier circuit according to claim 1.

* * * * *